US009196515B2

(12) United States Patent
Huang et al.

(10) Patent No.: US 9,196,515 B2
(45) Date of Patent: Nov. 24, 2015

(54) LITHO CLUSTER AND MODULIZATION TO ENHANCE PRODUCTIVITY

(71) Applicant: Taiwan Semiconductor Manufacturing Co., Ltd., Hsin-Chu (TW)

(72) Inventors: I-Hsiung Huang, Hsinchu County (TW); Heng-Hsin Liu, New Taipei (TW); Heng-Jen Lee, Baoshan Township (TW); Chin-Hsiang Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/551,302

(22) Filed: Nov. 24, 2014

(65) Prior Publication Data
US 2015/0076371 A1    Mar. 19, 2015

Related U.S. Application Data

(63) Continuation-in-part of application No. 13/429,921, filed on Mar. 26, 2012, now Pat. No. 8,903,532.

(51) Int. Cl.
*H01L 21/67*  (2006.01)
*H01J 37/317*  (2006.01)
(Continued)

(52) U.S. Cl.
CPC ............ *H01L 21/67225* (2013.01); *G03F 7/16* (2013.01); *G03F 7/30* (2013.01);
(Continued)

(58) Field of Classification Search
CPC ................... H01L 21/67276; H01L 21/67225; H01L 21/67745; G03F 7/16; G03F 7/30; G03F 7/70991; H01J 37/32899; H01J 37/3174; H01J 37/16
See application file for complete search history.

(56) References Cited

U.S. PATENT DOCUMENTS

| 6,893,171 B2 | 5/2005 | Fukutomi et al. |
| 2002/0132052 A1 | 9/2002 | Kumar et al. |

(Continued)

FOREIGN PATENT DOCUMENTS

| CN | 102124411 A | 7/2011 |
| EP | 1722402 B1 | 6/2010 |

(Continued)

OTHER PUBLICATIONS

U.S. Appl. No. 13/429,921, filed Mar. 26, 2012.
(Continued)

*Primary Examiner* — Brittany Raymond
(74) *Attorney, Agent, or Firm* — Eschweiler & Associates, LLC

(57) ABSTRACT

The present disclosure relates to a lithographic tool arrangement for semiconductor workpiece processing. The lithographic tool arrangement groups lithographic tools into clusters, and selectively transfers a semiconductor workpiece between a plurality of lithographic tools of a first type in a first cluster to a plurality of lithographic tools of a second type in a second cluster. The selective transfer is achieved though a transfer assembly, which is coupled to a defect scan tool that identifies defects generated in the lithographic tool of the first type. The disclosed lithographic tool arrangement also utilizes shared structural elements such as a housing assembly, and shared functional elements such as gases and chemicals. The lithographic tool arrangement may consist of baking, coating, exposure, and development units configured to provide a modularization of these various components in order to optimize throughput and efficiency for a given lithographic fabrication process.

20 Claims, 8 Drawing Sheets

(51) Int. Cl.
    *H01J 37/32* (2006.01)
    *H01J 37/16* (2006.01)
    *H01J 37/20* (2006.01)
    *G03F 7/16* (2006.01)
    *G03F 7/30* (2006.01)
    *G03F 7/20* (2006.01)
    *H01L 21/677* (2006.01)

(52) U.S. Cl.
    CPC ............ *G03F 7/70991* (2013.01); *H01J 37/16* (2013.01); *H01J 37/20* (2013.01); *H01J 37/3174* (2013.01); *H01J 37/32899* (2013.01); *H01L 21/67276* (2013.01); *H01L 21/67745* (2013.01)

(56) References Cited

U.S. PATENT DOCUMENTS

| | | |
|---|---|---|
| 2004/0123182 A1 | 6/2004 | Cross, Jr. et al. |
| 2004/0217302 A1 | 11/2004 | Shin et al. |
| 2007/0186850 A1 | 8/2007 | Matsuoka et al. |
| 2011/0162706 A1 | 7/2011 | Borden et al. |
| 2012/0238074 A1 | 9/2012 | Santhanam et al. |

FOREIGN PATENT DOCUMENTS

| | | |
|---|---|---|
| KR | 20110016644 A | 2/2011 |
| WO | 0002239 A1 | 1/2000 |
| WO | 0067302 A1 | 11/2000 |
| WO | 2007077901 A1 | 7/2007 |
| WO | 2007145315 A1 | 12/2007 |

OTHER PUBLICATIONS

Non-Final Office Action dated Feb. 14, 2014 for U.S. Appl. No. 13/429,921.

Notice of Allowance dated Jul. 18, 2014 for U.S. Appl. No. 13/429,921.

Chung, et al. "The Integrated Room Layout for a Semiconductor Facility Plan." IEEE Transactions on Semiconductor Manufacturing, vol. 20, No. 4, Nov. 2007.

LITHO CLUSTER AND MODULIZATION TO ENHANCE PRODUCTIVITY

REFERENCE TO RELATED APPLICATION

This application is a continuation-in-part of U.S. application Ser. No. 13/429,921 filed on Mar. 26, 2012 and entitled, "Litho Cluster and Modulization to Enhance Productivity", the contents of which are incorporated by reference in their entirety.

BACKGROUND

Integrated circuits (ICs) are formed by complex fabrication processes such as lithography. During lithography a semiconductor workpiece is subjected to different processing steps. Some of the processing steps may comprise coating of the semiconductor workpiece with photoresist chemicals, alignment of the semiconductor workpiece with a photomask to generate a pattern, exposure of the semiconductor workpiece to a KrF or ArF Laser or an electron beam, and developing the exposed semiconductor workpiece using a chemical solvent.

DETAILED DESCRIPTION

Figure 1:
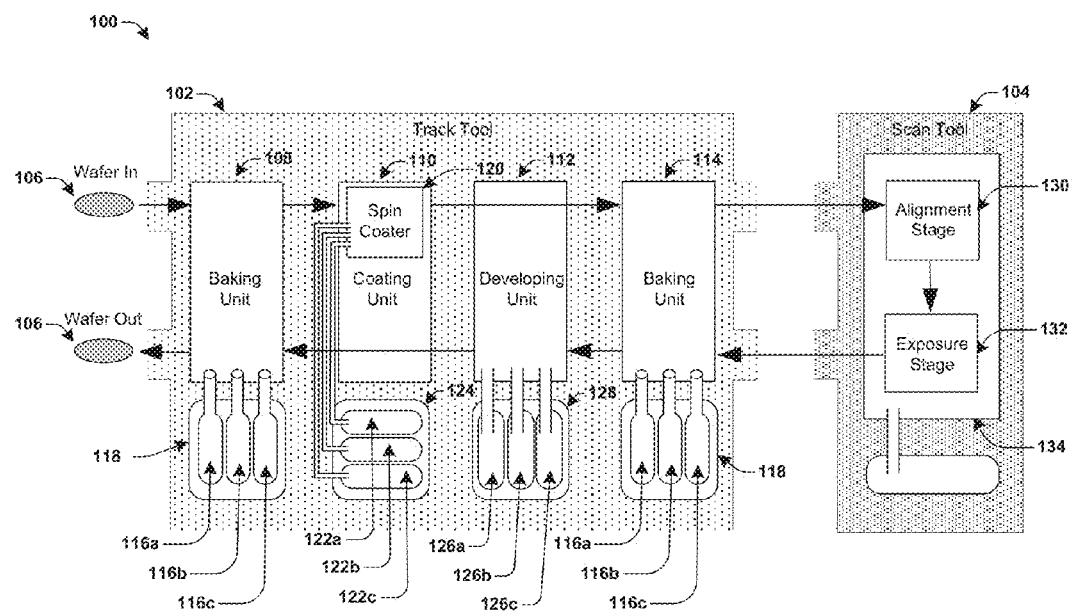
FIG. 1 illustrates a functional diagram of some embodiments of a lithographic tool cluster comprising a track tool and a scan tool.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1 illustrates a cross-sectional view of a semiconductor process tool arrangement 100, comprising a track tool 102 and a scan tool 104 for processing of a semiconductor workpiece 106. The track tool 102 comprises a first baking unit 108, a coating unit 110, a developing unit 112, and a second baking unit 114. Each baking unit is coupled to multiple chemical reservoirs 116a-116c contained within a chemical chamber 118. The coating unit 110 contains a spin coater 120, which is supplied with various photoresist chemicals 122a-122c contained within a resist chamber 124. The developing unit 112 is coupled to chemical solvents 126a-126c contained within a developer chamber 128. The scan tool 104 comprises an alignment stage 130 and an exposure stage 132, as well as common facilities 134 (e.g., vacuum).

A semiconductor workpiece 106 undergoes processing steps by passing though the various units of the track tool 102 and scan tool 104 as illustrated in FIG. 1. After being cleaned, the semiconductor workpiece is first placed within the track tool 102 and is baked in the first baking unit 108 to remove water from the workpiece surface (i.e., dehydrate the workpiece). The first baking unit 108, which can be a hotplate or similar in some implementations, can bake the workpiece, for example, at a temperature of between 80° C. and 250° C. for a time of between 10 seconds and 180 seconds. The workpiece is then placed on the spin coater 120 where it is coated with a photoresist chemical 122a, 122b, or 122c. Before photoresist is applied, the workpiece can first be coated with hexamethyldisilazane (also known as HDMS or Bis(trimethylsilyl)amine), which promotes adhesion of photoresist to the workpiece surface. After spin coating, the workpiece is baked in the second baking unit 114. At this point, this second baking unit 114, which can be a hotplate in some implementations, performs a "soft bake" or "prebake to dry the applied photoresist on the workpiece and thereby removes excess solvent from the photoresist. The semiconductor workpiece is then transferred into the scan tool 104, aligned with a photomask in the alignment stage 130, and exposed to electromagnetic radiation or an electron beam in the exposure stage 132. This exposure thus transfers a pattern on the photomask into the chemical matrix of the photoresist. After exposure, the semiconductor workpiece is then transferred back to the track tool 102, where the second baking unit 114 again bakes the workpiece—this time by using a "post exposure bake" routine. Although the precise mechanism is not well understood, it is believed this post-exposure bake removes standing wave effects in the exposed photoresist to better prepare the photoresist for developing and, in some cases, may also help create a suitable solubility difference between exposed and un-exposed regions of the photoresist. The exposed photoresist of the semiconductor workpiece is then developed in the developing unit 112 using one of the chemical solvents 126a, 126b, or 126c. The chemical solvents in developing unit 112 selectively remove the exposed or unexposed regions of photoresist, depending on whether the positive or negative photoresist is used. Finally, a fourth baking step is performed in the first baking unit 108. This fourth baking step, which may also be referred to as a "hard bake", hardens the developed photoresist image to withstand harsh environments expected to be encountered in implantation or etching processes. The workpiece can then be processed, for example implanted or etched, with the pattern in place; and after such processing the photoresist layer can be stripped and additional layers can be formed and patterned in a similar manner. In this way, successive layers of an IC can be built up.

A key drawback of this arrangement occurs when multiple semiconductor workpieces require different processing in the same semiconductor process tool cluster 100. For instance, consider a semiconductor workpiece 106, which is coated with photoresist chemical 122a of a first type, followed by a second semiconductor workpiece (not shown) to be coated with photoresist chemical 122b of a second type. The spin coater 120 of this arrangement will require a time delay between these two coating steps during which it can be cleaned of the photoresist chemical 122a to prevent contamination during the processing with photoresist chemical 122b. Moreover, it will be appreciated by one of ordinary skill in the art that each of the various units of the track tool 102 and scan tool 104 will experience a similar time delay when a given processing step is altered for processing two semiconductor workpieces differently. Each time delay results in a subsequent throughput loss of the semiconductor process tool cluster 100. Delays can also be experienced if one of the tools, such as spin coater 120, goes down for maintenance, which can cause a wafer "backlog" to occur just in front of the tool that has gone down.

Accordingly, the present disclosure relates to a semiconductor process tool arrangement for semiconductor workpiece processing to improve efficiency and throughput. The semiconductor process tool arrangement includes a plurality of semiconductor processing cluster tools. A transfer assembly selectively transfers semiconductor workpieces between any one of a plurality of semiconductor processing tools in a first cluster tool to any one of a plurality of semiconductor processing tools in a second cluster tool. In various embodiments the semiconductor process tools comprise baking, coating, exposure, and/or developing semiconductor processing tools configured to provide a modularization of these various components to optimize throughput and efficiency for a given process. In some implementations, these cluster tool arrangements can also limit floor space required for tools in the fab, limit piping required to route chemicals through the fab, and/or allow for re-use of materials (e.g., photoresist) in the fab, while also promoting earlier identification of sources of defects to improve the overall manufacturing flow.

Figure 2:
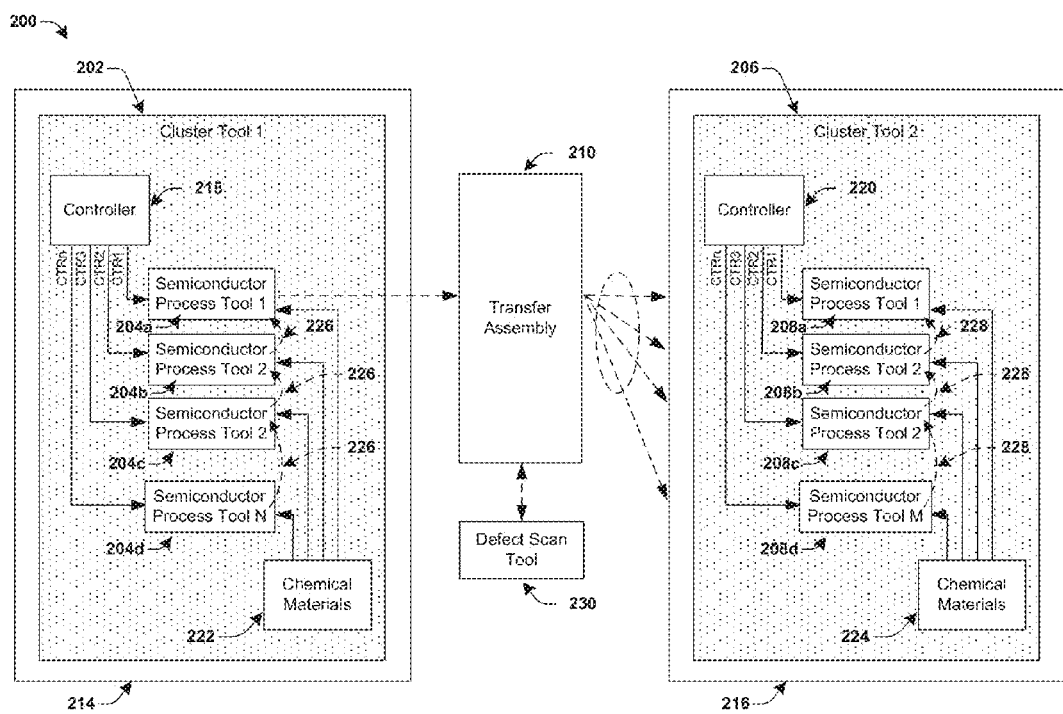
FIG. 2 illustrates some embodiments of a semiconductor process tool arrangement for semiconductor workpiece processing.

FIG. 2 illustrates some embodiments of a semiconductor process tool arrangement 200 which comprises a first cluster tool 202 comprising a plurality of semiconductor processing tools 204a-204d of a first type, a second cluster tool 206 comprising a plurality of semiconductor processing tools 208a-204d of a second type, and a transfer assembly 210 to move a semiconductor workpiece from any one of the plurality of semiconductor processing tools 204a-204d of to any one of the plurality of semiconductor processing tools 208a-208d. In this embodiment it is shown that a semiconductor workpiece processed by semiconductor process tool 204a in the first cluster tool 202 could be selectively transferred to any of the semiconductor process tools 208a-208d in the second cluster tool 204.

The tool arrangement 200 also comprises a shared housing assembly for the first cluster tool 214, and a shared housing assembly for the second cluster tool 216, which serve to isolate their respective semiconductor process tools from the ambient environment surrounding each cluster tool. Each cluster tool further comprises a controller, 218 and 220 for the first and second cluster tools respectively, which allow for independent control of their respective semiconductor process tools. For example, controller 218 allows for each of the semiconductor process tools 204a-204d of the first type to be operated independently.

Common delivery apparatuses, 222 and 224 for the first and second cluster tools 202, 206, respectively, allow for delivery of chemical materials within each tool. The common delivery apparatuses 222 and 224 also enable sharing and recycling of the chemical materials between the lithographic tools within each respective cluster, 202, 206.

The transfer assembly 210 is coupled to a defect scan tool 230 located between the first and second cluster tools 202, 206. The defect scan tool 230 analyzes a semiconductor workpiece to identify defects generated upstream of the second cluster tool 206. For example, the defect scan tool 230 can identify defects generated by first cluster tool 202 or by tools upstream of first cluster tool 202.

Note that while the semiconductor process tool arrangement 200 comprises two cluster tools, 202, 206, that share a single transfer assembly 210, it will be appreciated to one of ordinary skill in the art that other embodiments may comprise three or more cluster tools with a plurality of transfer assemblies between each pair of cluster tools, or a single transfer assembly that operates between any combination of cluster tools.

Because the semiconductor process tool arrangement 200 is modularized into first and second cluster tools 202, 206; it promotes easy floor planning in the fab, particularly when extended to an entire process flow such as previous described in FIG. 1. For example, pre-bake units can be floor planned into a first dedicated floor space of the fab, coating units can be floor planned into a second dedicated floor space of the fab, developing units can be floor planned into a third dedicated floor space of the fab, and so on. This modularization can simplify management and maintenance of the fab, and can also simplify piping for various chemicals flowing through the fab. In addition, this modularization can allow for flexible processing of wafers by the transfer assembly 210, whereby different wafers can go through different tool sequences during the manufacturing process in an efficient way. In addition to promoting efficient use of floor space within the fab, flexible wafer sequencing between cluster tools can mitigate extreme backlogs experienced when a tool goes down for maintenance because wafers slated to be processed by that tool can be re-routed to other tools when the maintenance issue is detected.

Figure 3:
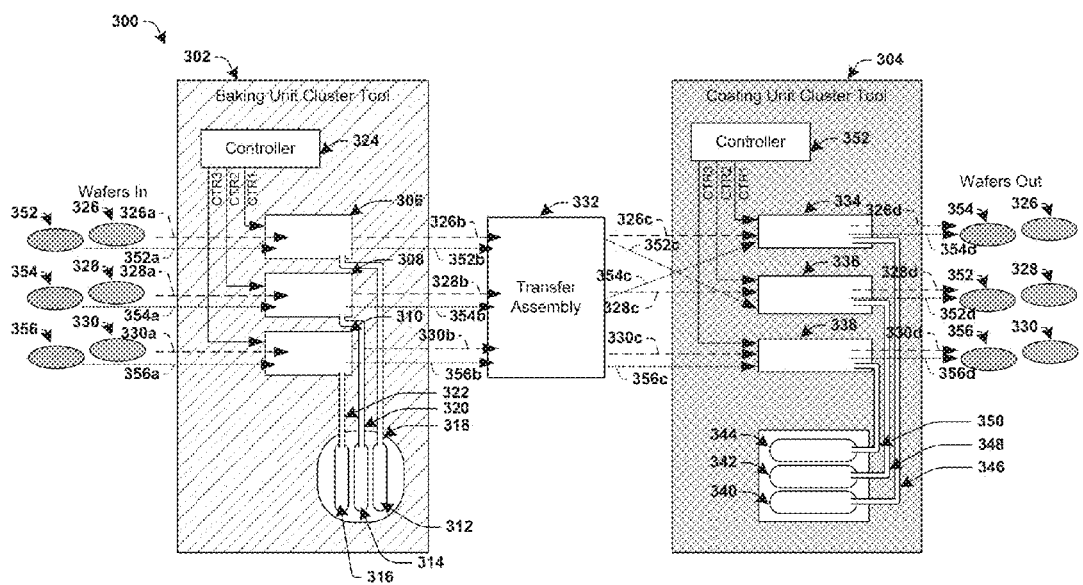
FIG. 3 illustrates some embodiments of a lithographic tool arrangement comprising a baking unit cluster tool and a coating unit cluster tool.

FIG. 3 illustrates a more particular example semiconductor processing system 300 with a baking unit cluster tool 302 made up of multiple baking elements 306, 308, 310; and a coating unit cluster tool 304 made up of multiple spin coaters 334, 336, 338. Controller 324 provides independent control of baking elements 306, 308, 310, such that different baking times and/or baking temperatures can be implemented on baking element 306, 308, 310; and controller 352 provides independent control of spin coaters 334, 336, 308, such that different chemicals or spin conditions (e.g., spin time, rotational velocity, or rotational acceleration) can be implemented for different spin coaters. As will be appreciated in greater detail below, this system 300 allows for parallel processing of wafers, and transfer assembly 332 transfers workpieces between the cluster tools 302, 304 in a flexible manner.

In the illustrated example of FIG. 3, a first lot of wafers (326, 328, 330) are initially processed in parallel, and second lot of wafers (352, 354, 356) are processed in parallel immediately behind (or even partially overlapping) the first lot of wafers. More particularly, the first lot of wafers 326, 328, and 330 are initially loaded onto the baking units 306, 308, 310, respectively (see lines 326a, 328a, and 330a, respectively). This loading can occur at the same time, sequentially, or during overlapping times. The baking units 306, 308, 310, which can manifest as hotplates, can bake the wafers to dehydrate the wafers. The wafers 326, 328, and 330 can then be coated with HDMS or other chemical solutions. The HDMS or other solutions are contained in chemical reservoirs 312, 314, and 316, and are supplied to the wafers 326, 328, and 330, respectively, through respective piping 318, 320, and 322. After HDMS application, the transfer assembly 332 then unloads the wafers 326, 328, 330 from the baking units 306, 308, 310, respectively (see lines 326b, 328b, 330b); and loads the respective wafers onto respective coating units 334, 336, and 338, respectively (see lines 326c, 328c, 330c, respectively). The coating units 334, 336, 338 apply a thin coating of photoresist to an upper surface of respective wafers, typically by a "spin on" process. The photoresist is contained in photoresist reservoirs 340, 342, and 344 and is supplied to the respective spin coaters 334, 336, and 338 through respective piping 346, 348, 350. After being coated with photoresist, the wafers can then be transferred to another processing tool (see lines 326d, 328d, 330d, respectively).

The second lot of wafers 352, 354, 356 are loaded on the baking units 306, 308, 310, respectively, (see lines 352a, 354a, 356a, respectively); processed by the baking units 306, 308, 310, respectively; then transferred by the transfer assembly 332 to coating units 336, 334, 338, respectively, where they are coated. Notably, in the illustrated example, wafers of the first and second lots pass through the cluster tools according to different cluster tool sequences. For example, first wafer 326 of first lot is processed by first baking unit 306 and first coating unit 334; while first wafer 352 of second lot is processed by the first baking unit 306 and the second coating unit 336. Thus, the wafers 326 and 352 take different "processing paths" through the arrangement of cluster tools.

In general, the transfer assembly 332 can transfer a wafer from any of the baking units of 302 to any coating units in 304, although rules could be established to block some transfer paths in some embodiments. This flexible cluster tool sequencing allows for greater process diversification over different lots of wafers (or even within a given lot of wafers). For example, if the first and second baking units 306, 308 bake at 90° C. and 100° C., respectively; and the first and second coating units 334, 336 use positive and negative photoresist, respectively; the first wafer 326 of first lot will be baked at 90° C. and have positive resist applied, and the first wafer 352 of the second lot will be baked at 90° C. but have negative resist applied. Thus, because the baking units can have different individually fixed or individually flexible baking routines and the coating units can have different individually fixed or individually flexible coating routines, and because the transfer assembly 332 provides selective transfer of wafers therebetween, significant flexibility in processing can be achieved. This can save fab reconfiguration and/or cleaning time. Further, in the event that a tool, such as a coating unit, goes down, the transfer assembly 332 is able to re-route wafers originally scheduled to be processed by that deficient coating unit to another coating unit when the deficiency is detected to attempt to limit processing backlogs somewhat.

Figure 4:
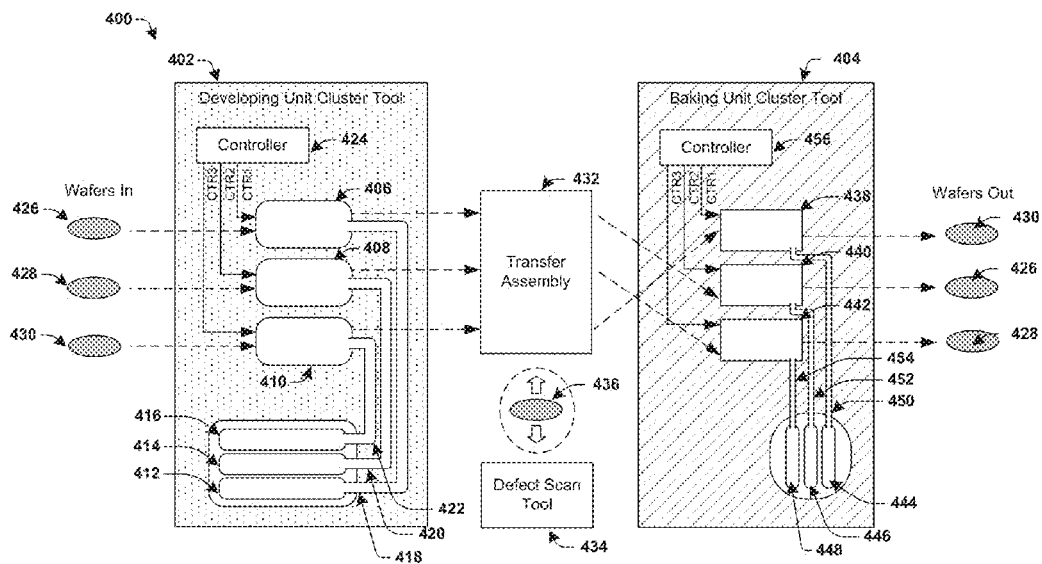
FIG. 4 illustrates some embodiments of a semiconductor process tool arrangement comprising a developing unit and a baking unit.

FIG. 4 illustrates some embodiments of a semiconductor process tool arrangement 400 comprising a developing unit cluster tool 402 and a baking unit cluster tool 404. The developing unit cluster tool 402 comprises three developing stations 406, 408, and 410 each coupled to a respective chemical reservoir 412, 414, and 416 through respective piping 418, 420, and 422. Each of the three developing stations 406, 408, and 410 can be independently controlled with a controller 424. The developing unit cluster tool 402 shown in this embodiment can accommodate three separate semiconductor workpieces 426, 428, and 430, but can be extended to any number. Each semiconductor workpiece 426, 428, and 430 has undergone a previous exposure step which includes coating with photoresist, alignment with a photomask, and exposure to electromagnetic radiation or an electron beam as described above.

Each chemical reservoir 412, 414, and 416 contains a chemical developer solution (e.g., alkaline solution) which is used to react with the photoresist film of the exposed semiconductor workpiece. The reaction depends on the type of photoresist solution used. The most common type of photoresist is positive photoresist, which becomes soluble when exposed and reacted with the developer solution. Unexposed positive photoresist becomes insoluble. The exposed positive photoresist is removed by the developer solution, thus creating a pattern of positive photoresist on the semiconductor workpieces 426, 428, and 430 that corresponding to the covered regions of the photomask. Negative resist has the opposite effect. The separate chemical reservoirs 412, 414, and 416 containing different chemical developer solutions, along with the controller 424 shown in this embodiment allow for independent control of each developing station 406, 408, and 410. Such independent control could allow for the use of different resist types for each developing station 406, 408, and 410, as well as different temperatures, rinse/flow rates of developer, rinse duration, and so on.

After the developing step, the semiconductor workpieces 426, 428, and 430 are moved out of the developing unit cluster tool 402 via a transfer assembly 432, and into a selected baking unit 438, 440, or 442 contained within the baking unit cluster tool 404. Each of three baking units 438, 440, and 442 are coupled to respective chemical reservoirs 444, 446, and 448 through respective piping 450, 452, and 454. Each of the three baking units can be independently controlled with a controller 456. The semiconductor workpieces 426, 428, and 430 are subjected to a post-develop bake, or post-bake, typically at 120° C. to 180° C. for approximately 1 to 3 minutes. This will harden the remaining photoresist so that it can be used as a protective layer for downstream fabrication steps such as ion implantation, wet chemical etching, or plasma etching.

In this embodiment the transfer assembly 432 allows for selective transfer of a given semiconductor workpiece 426, 428, or 430 to any of the baking units 438, 440, or 442 contained within the baking unit cluster tool 404. This selective transfer of the transfer assembly 432, along with the independent control of the baking units 438, 440, and 442, allows for multiple developing and baking processes to occur in parallel. For example, semiconductor workpiece 426 could be coated with positive photoresist prior to exposure and reacted with a developer solution (e.g., 2.38% TMAH) in developer 406, while semiconductor workpiece 428 could be coated with negative photoresist prior to exposure and reacted with a negative developer solution (e.g., OSD-1000) in developer 408. The transfer assembly 432 removes semiconductor workpiece 426 from developer 406 and selects baking unit 440 to give semiconductor workpiece 426 at post-bake at 120° C. for approximately 2 minutes. Independently, the transfer assembly moves semiconductor workpiece 428 from developer 408 to baking unit 442 to give semiconductor workpiece 428 a post-bake at 180° C. for approximately 3 minutes. The transfer assembly 432 allows subsequent wafers to go through different processing paths in system 400, similar to as previously described with regards to FIG. 3.

In this embodiment the transfer assembly 432 is also coupled to a defect scan tool 434 which can transfer a semiconductor workpiece 436 to the defect scan tool to identify defects introduced upstream from the baking unit cluster tool 404 (e.g., by the developing unit cluster tool 402).

Figure 5:
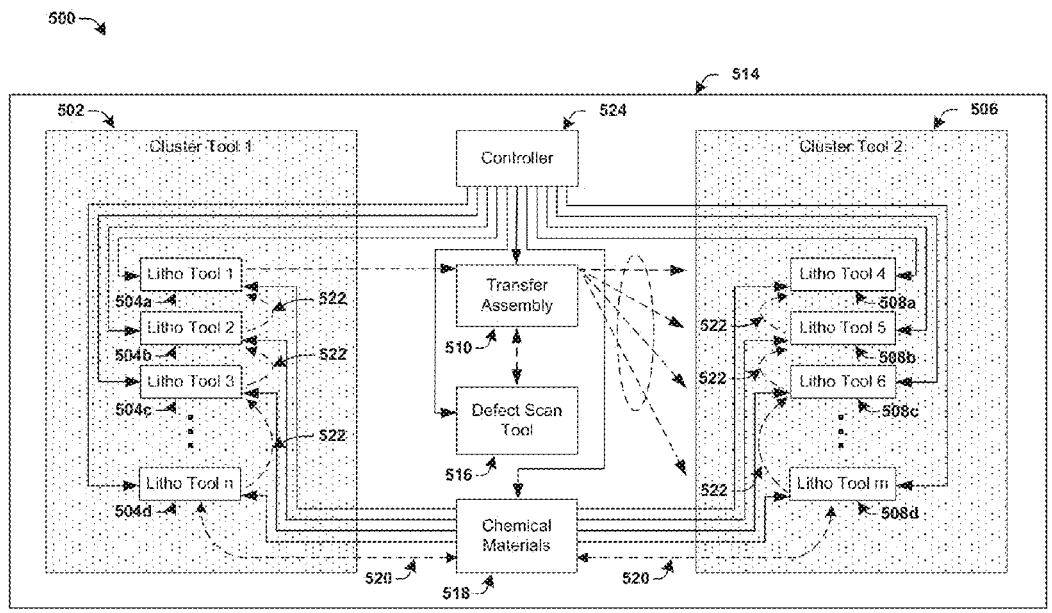
FIG. 5 illustrates some embodiments of a tool arrangement for semiconductor workpiece processing.

FIG. 5 illustrates some embodiments of a tool arrangement 500 for semiconductor workpiece processing comprising a first cluster tool 502 comprising a plurality of semiconductor process tools 504a-504d of a first type, a second cluster tool 506 comprising a plurality of semiconductor process tools 508a-508d of a second type, and a transfer assembly 510. The transfer assembly 510 moves a semiconductor workpiece from any one of the plurality of semiconductor process tools 504a-504d of to any one of the plurality of semiconductor process tools 508a-508d. In this embodiment it is shown that a semiconductor workpiece selected from semiconductor process tool could be selectively transferred to any of the semiconductor process tools 508a-508d.

The tool arrangement 500 also comprises a shared housing assembly 514 to isolate it from the ambient environment. The transfer assembly 510 is coupled to a defect scan tool 516 located between the first and second cluster tools 504 and 506. The defect scan tool 516 analyzes a semiconductor workpiece to identify defects generated upstream from the second cluster tool 506. The tool arrangement 500 also comprises a common delivery apparatus 518 for delivery of chemical materials to the semiconductor process tools 504a-504d and 508a-508d. The chemical materials from the common delivery apparatus 518 can be shared and recycled 520 between the cluster tools 502 and 506. The chemical materials from the common delivery apparatus 518 can also be shared and recycled 522 between the semiconductor process tools 504a-504d and 508a-508d. The semiconductor process tools 504a-504d and 508a-508d, transfer assembly 510, defect scan tool 516, and common delivery apparatus 518 are independently controlled by a centralized controller 524.

Note that while the tool arrangement 500 comprises two cluster tools, 502 and 506, that share a single transfer assembly 510 it will be appreciated to one of ordinary skill in the art that other embodiments may comprise three or more cluster tools with multiple transfer assemblies between each pair of cluster tools, or a single transfer assembly that operates between any combination of cluster tools.

Figure 6:
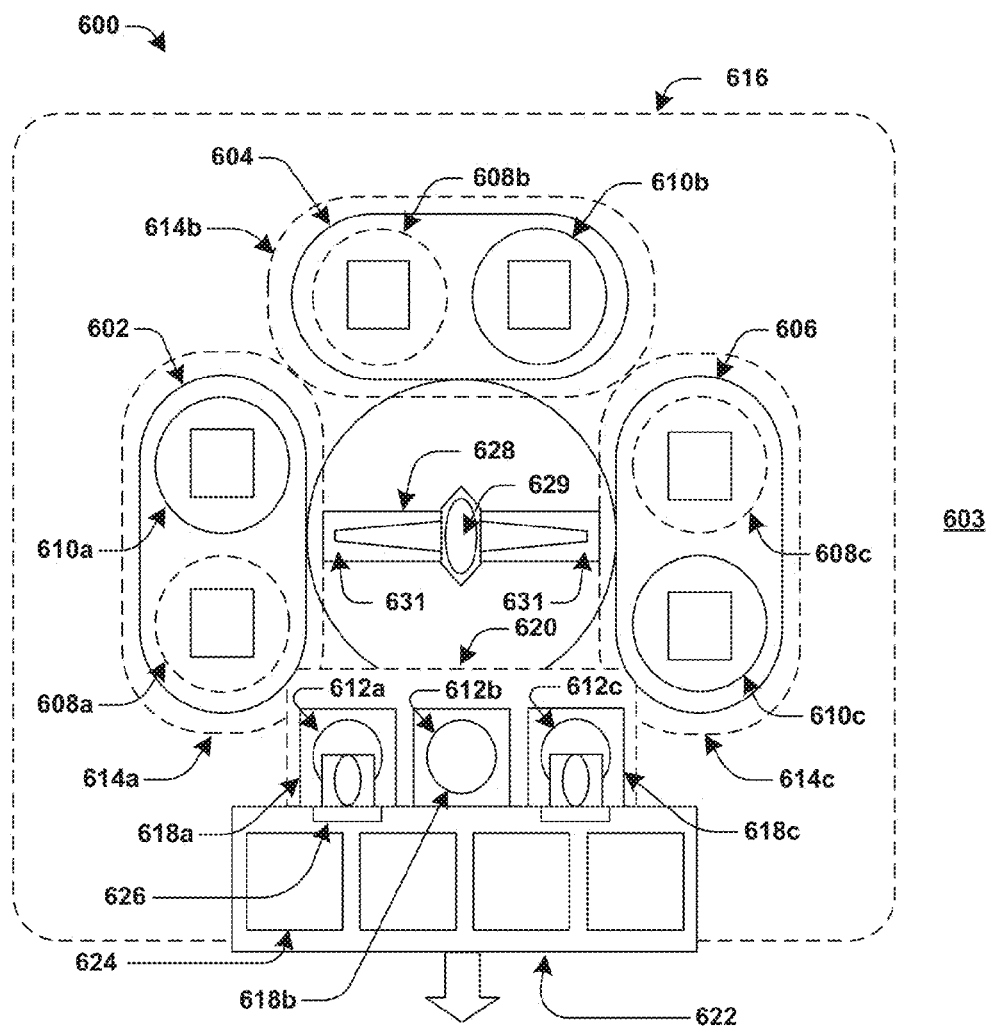
FIG. 6 illustrates some detailed embodiments of a semiconductor process tool arrangement in the form of an electron beam direct write (EBDW) tool comprising three exposure tools housed in a vacuum chamber.

FIG. 6 illustrates some embodiments of a semiconductor processing arrangement 600 in the form of an ebeam direct write (EBDW) tool comprising of three exposure tools 602, 604, and 606, each comprising an alignment stage 608a-608c and an exposure stage 610a-610c, respectively. Each exposure tool 602, 604, and 606 is housed in a vacuum chamber, 614a-614c respectively, that achieve an ultra-high vacuum, or UHV (e.g., $1 \times 10^{-12}$ to $1 \times 10^{-9}$ Torr). The lithographic tool arrangement 600 further comprises a shared housing assembly comprising a transfer chamber 616, which in this embodiment is a medium vacuum chamber (e.g., $1 \times 10^{-3}$ to 25 Torr) that is kept at a first pressure lower than an ambient pressure of ambient environment 603. The three exposure tools 602, 604, and 606 of the lithographic tool arrangement 600 can accommodate three separate semiconductor workpieces 612a-612c, which can be loaded into the transfer chamber 616 through three load locks 618a-618c, respectively. Loadlocks 618a-618c are each kept at a second pressure that is between the first pressure and ambient pressure. For example, vacuum chamber 620 of loadlock can be kept at low vacuum (e.g., 25 to 760 Torr). In this embodiment the exposure units 602, 604, and 606 as well as the loadlocks 618a-618c, are positioned radially about a diametric transfer arm 628. The exposure units retain a third pressure that is less than the second pressure, and can be a high vacuum (e.g., less than 1 torr) or even an ultra-high vacuum (e.g., $10^{-9}$ to $10^{-12}$ torr). When not in use, the semiconductor workpieces 612a-612c can be moved out of loadlocks 618a-618c and housed in a Standard Mechanical InterFace, or SMIF pod 622 which is typically used for wafers 200 mm or less in diameter, or a Front Opening Unified Pod (FOUP) which is typically used for 300 mm or 450 mm wafers. These pods keep the semiconductor workpieces 612a-612c isolated from contamination. The SMIF pod 622 contains a wafer cassette 624 in which the wafers can be stored horizontally. Therefore, SMIF pod 622 can house many more wafers than the three that can be used by the lithographic tool arrangement 600 at any given time.

To expose a semiconductor workpiece, 612a for instance, the workpiece is moved from the wafer cassette 624 in the SMIF pod 622 via a load lock transfer arm 626 into a given loadlock, 618a. The semiconductor workpiece 612a is then moved out of the loadlock 618a, through the transfer chamber 616 via the diametric transfer arm 628, and into a selected exposure tool 602, 604, or 606. The diametric transfer arm 628 rotates about a pivot point 629, which corresponds to a central region of the diametric transfer arm 628, to selectively transfer the semiconductor workpiece from the loadlock 618a to an alignment stage or exposure stage of an exposure unit. The diametric transfer arm 628 includes wafer engagement elements 631, such as mechanical grippers or suction elements, at distal ends thereof.

For this embodiment each exposure tool may be unique. For instance, exposure tool 602 may comprise an extreme ultraviolet (EUV) tool, whereas exposure tool 604 may comprise an electron beam direct write (EBDW) tool. The diametric transfer arm 628 places the semiconductor workpiece 612a onto the alignment stage 608a-608c of a given exposure tool, 602, 604, and 606 respectively. For this embodiment consider exposure tool 602 is an extreme ultraviolet (EUV) illumination tool. The semiconductor workpiece 612a is thus placed on the alignment stage 608a of exposure tool 602, and aligned with a photomask (not shown). The photomask contains a pattern that will be transferred to the semiconductor workpiece 612a in a manner that will be described below. After alignment the semiconductor workpiece 612a is transferred within exposure tool 602 to the exposure stage 610a. The semiconductor workpiece 612a is then subjected to extreme ultraviolet electromagnetic radiation. The photomask pattern will shield some portions of the semiconductor workpiece 612a from the electromagnetic radiation, while leaving other portions of the semiconductor workpiece 612a covered, thus transferring the photomask pattern onto the semiconductor workpiece 612a.

Figure 7:
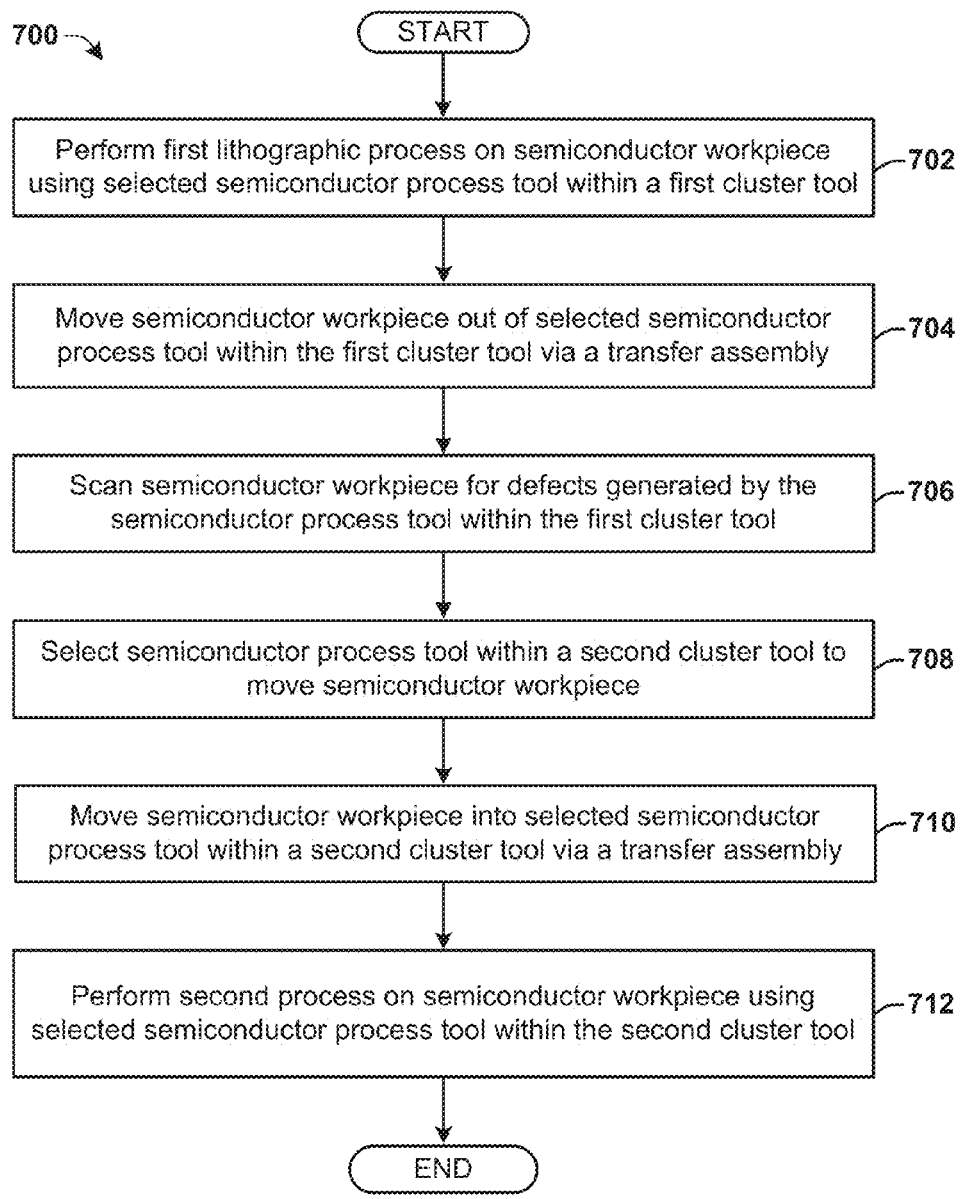
FIG. 7 illustrates a flow diagram of some embodiments of a method for operating a semiconductor process tool arrangement for semiconductor workpiece processing.

FIG. 7 illustrates a flow diagram of some embodiments of a method 700 for operating a tool arrangement for semiconductor workpiece processing configured to group a plurality of semiconductor process tools of a given type into clusters. The method 700 allows for selective transfer of a semiconductor workpiece between any one of a plurality of lithographic tools in a first cluster to any one of a plurality of semiconductor process tools in a second cluster. While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 702 a first semiconductor process is performed to a semiconductor workpiece using a selected semiconductor process tool within a first cluster tool. In some embodiments, the first semiconductor process may comprise baking, coating, exposing and developing of a semiconductor workpiece.

At step 704 a transfer assembly moves the semiconductor workpiece out of the semiconductor process tool within the first cluster tool.

At step 706 the semiconductor workpiece is scanned with a defect monitoring tool to identify defects generated within the first semiconductor process tool.

At step 708 the transfer assembly selects a semiconductor process tool from plurality of semiconductor process tools contained within a second cluster tool.

At step 710 the transfer assembly moves the semiconductor workpiece into the selected semiconductor process tool within the second cluster tool.

At step 712 a second semiconductor process is performed to the semiconductor workpiece using the selected semiconductor process tool within the second cluster tool. In some embodiments, the second semiconductor process may comprise baking, coating, exposing and developing of a semiconductor workpiece.

Figure 8:
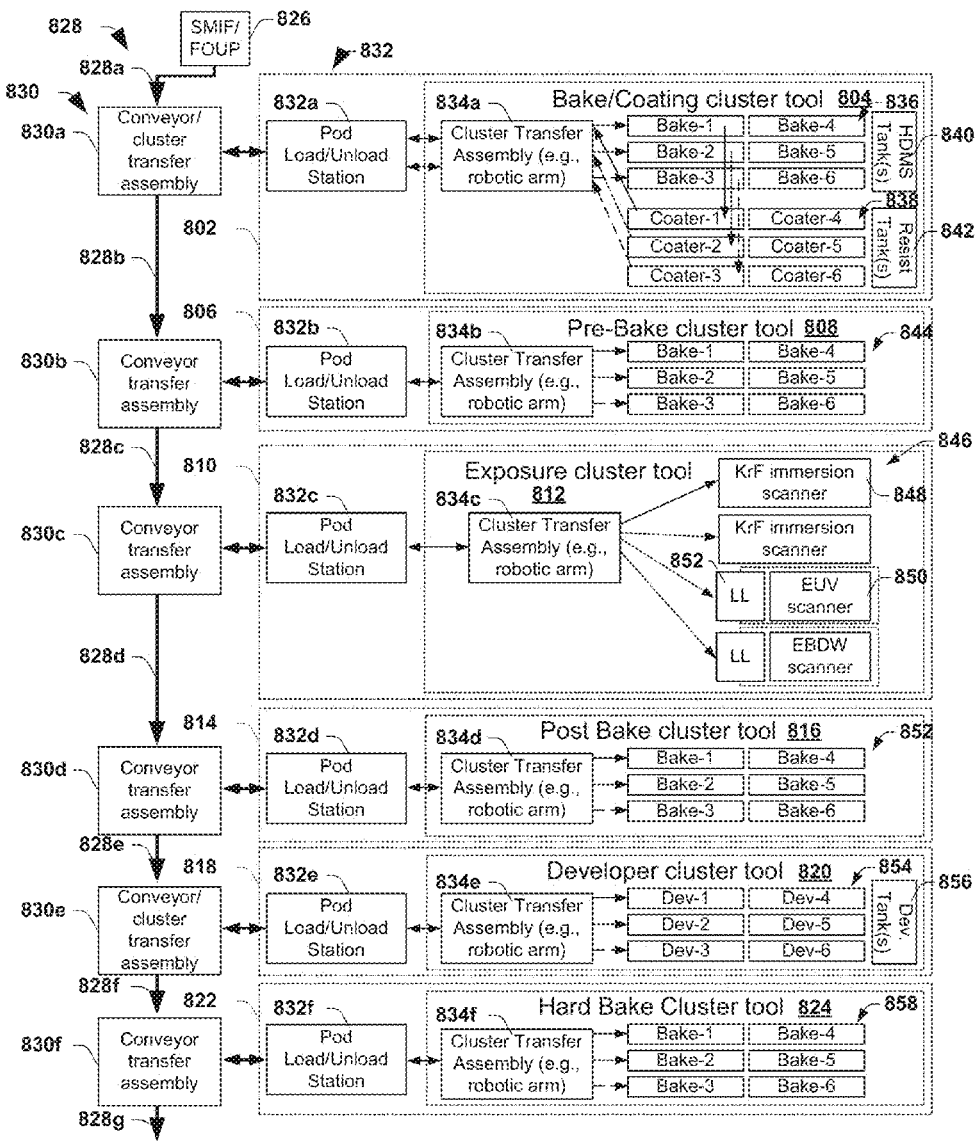
FIG. 8 illustrates a portion of a semiconductor fabrication facility or "fab" in accordance with some embodiments.

FIG. 8 illustrates an operational workflow depicting how semiconductor wafers are processed in a semiconductor manufacturing facility or "fab" 800 in accordance with some embodiments. In this example, the floor space of the fab 800 is organized into different areas, which are reserved for different cluster tools. For example, a first floor space region 802 is dedicated for bake/coating cluster tools 804, a second floor space area 806 is dedicated for pre-bake cluster tools 808, a third floor space area 810 is dedicated for exposure cluster tools 812, a fourth floor space area 814 is dedicated for post-bake cluster tools 816, a fifth floor space area 818 is dedicated for developer cluster tools 820, and a sixth floor space area 822 is dedicated for hard bake cluster tools 824.

In the illustrated embodiment, each dedicated floor space area is illustrated as corresponding to an individual cluster tool which has its own housing that encloses its semiconductor processing tools. For example, the illustrated pre-bake cluster tool 808 corresponds to the entire floor space dedicated for pre-bake cluster tools 806. Although only a single pre-bake cluster tool 808 is shown, multiple pre-bake cluster tools each having their own housing can be arranged within the second floor space area 806 in other embodiments. The same is true of the other cluster tools. If present, multiple cluster tools can share a Pod Load/Unload station and/or Conveyor transfer assembly, but can more commonly have their own respective Pod Load/Unload stations and their own respective Conveyor transfer assemblies to potentially improve processing flexibility and throughput. Compared to traditional floor-planning arrangements where commercial "track tools" are utilized (each of which can include a mix of spin coater(s), hotplate(s), piping and control unit(s) within the track unit's individual housing), this fab floor-planning arrangement 800 with dedicated floor space areas can simplify piping, ease maintenance, and simplify re-routing of wafers if a tool goes down due to maintenance concerns. This arrangement can also help retain trade secrets where applicable, as viewing of different types of tools is more modularized compared to other approaches.

During operation, lots of wafers move in SMIF pods or FOUPs 826 through the different floor space areas of the fab under the direction of one or more process controllers (not shown). During this process, the pods 826 travel along a conveyor 828, such as an overhead conveyor from which pods hang and/or from a belt conveyor on which pods sit. Conveyor cluster transfer assemblies 830, such as an elevator, hoist, or robotic arm for example, can transfer the SMIF pods or FOUPs 826 from the conveyor 828 to Pod Load/Unload stations 832 the cluster tools. Once on a Pod Load/Unload station, a SMIF pod or FOUP is opened, and a cluster transfer assembly for a given cluster tool individually moves the wafers from the opened SMIF pod or FOUP to the semiconductor processing tools of the cluster tool. After processing is completed in a given cluster tool, the wafers are reloaded into the SMIF pod or FOUP, the SMIF pod or FOUP is closed and returned to the conveyor to travel to the next cluster tool.

Typically, the SMIF pods and FOUPs have a bar code or RFID that uniquely identifies that SMIF pod or FOUP so locations of wafers or lots in the fab can be tracked. Wafers can also have individual bar codes, RFIDs, or other identification mechanisms.

More particularly, in the illustrated embodiment, SMIF pod or FOUP 826 is loaded onto first conveyor segment 828a and travels to the first floor space area 802. The first conveyor transfer assembly 830a transfers the SMIF pod or FOUP 826 from the conveyor 828 onto the first Pod Load/Unload station 832a, wherein the pod 826 is opened. A first cluster transfer assembly 834a then transfers wafers from the opened pod into the individual baking units 836a-836f, and the wafers are then baked to remove water from the wafer surface (i.e., dehydrate the wafer). The baking units 836, each of which can be a hotplate in some implementations, can bake the wafers, for example, at a temperature of between 80° C. and 250° C. for a time of between 10 seconds and 180 seconds. The wafers can also be coated with hexamethyldisilazane (also known as HDMS or Bis(trimethylsilyl)amine), which is stored in HDMS tank(s) 840, in the baking units to promote adhesion of photoresist to the wafer surface. The wafers are then transferred to the spin coaters 838 where they are coated with a photoresist chemical stored in resist tank(s) 842. Notably, because the HDMS and photoresist are limited in their distribution to the bake/coating cluster tool 802, which resides within dedicated fab floor space 802, piping for HDMS and photoresist is simplified compared to previous "track tool" implementations where spin coaters and baking elements were distributed over a wider area of fab floor space. Additionally, the piping can be setup to allow for recycling of excess photoresist which is spun off the wafers during spin-coating to be used to coat subsequent wafers. After spin coating 838, the wafers are re-loaded into the pod on the Pod Load/Unload station 832a, the pod is closed, and the first conveyor cluster transfer assembly 830a provides the pod back to the conveyor 828.

A second conveyor segment 828b then transfers the pod 826 to the second floor space area 806 where the pre-bake cluster tool 808 resides. The second conveyor transfer assembly 830b transfers the SMIF pod or FOUP 826 from the conveyor 828 onto the second Pod Load/Unload station 832b, wherein the pod is again opened. A second cluster transfer assembly 834b then transfers wafers from the opened pod into individual pre-baking units 844, which can be hotplates in some implementations. The pre-baking baking units 844 perform a "soft bake" or "prebake" on the wafers, which dries the applied photoresist and thereby removes excess solvent from the photoresist. After soft-baking, the wafers are re-loaded into the pod on the second Pod Load/Unload station 832b, the pod is closed, and the second conveyor cluster transfer assembly 830b provides the pod back to the conveyor 828.

A third conveyor segment 828c then transfers the wafers to the third floor space area 810 where the exposure cluster tool 812 resides. The third conveyor transfer assembly 830c transfers the SMIF pod or FOUP 826 from the conveyor 828 onto the third Pod Load/Unload station 832c, wherein the pod is again opened. A third cluster transfer assembly 834c then transfers wafers from the opened pod into individual scan tools 846, where the wafers are aligned with a photomask in an alignment stage, and exposed to electromagnetic radiation or an electron beam in an exposure stage. The scan tools 846 can include an immersion scanner 848, such as a Krypton fluoride (KrF) immersion scanner, and/or an extreme ultraviolet (EUV) scanner 850 which is under vacuum and to which wafers are exposed after passing through a load-lock 852. This exposure thus transfers a pattern on the photomask into the chemical matrix of the photoresist. After exposure, the wafers are re-loaded into the pod on the third Pod Load/Unload station 832c, the pod is closed, and the third conveyor cluster transfer assembly 830c provides the pod back to the conveyor 828.

A fourth conveyor segment 828d then transfers the wafers to the fourth floor space area 814 where the post-bake cluster tool 816 resides. The fourth conveyor transfer assembly 830d transfers the SMIF pod or FOUP from the conveyor 828 onto the fourth Pod Load/Unload station 832d, wherein the pod is again opened. A fourth cluster transfer assembly 834d then transfers wafers from the opened pod into individual post-bake tools 852, and a post-bake procedure is carried out in which the photoresist-covered wafers are baked at between 100° C. and 130° C., for example. Although the precise mechanism is not well understood, it is believed this post-exposure bake removes standing wave effects in the exposed photoresist to better prepare the photoresist for developing and, in some cases, may also help create a suitable solubility difference between exposed and un-exposed regions of the photoresist. After post-baking, the wafers are re-loaded into the pod on the fourth Pod Load/Unload station 832d, the pod is closed, and the fourth conveyor cluster transfer assembly 830d provides the pod back to the conveyor 828.

A fifth conveyor segment 828e then transfers the wafers to the fifth floor space area 818 where the developer cluster tool 820 resides. The fifth conveyor transfer assembly 830e transfers the SMIF pod or FOUP from the conveyor 828 onto the fifth Pod Load/Unload station 832e, wherein the pod is again opened. A fifth cluster transfer assembly 834e then transfers wafers from the opened pod into individual developing units 854, and the exposed photoresist of the semiconductor wafers are then developed in the developing units 854 by applying (e.g., spraying) developer solution from developer tank(s) 856 onto the exposed photoresist on the wafers. The developer selectively removes the exposed or unexposed regions of photoresist, depending on whether the positive or negative photoresist is used. Notably, because the developer is limited in its distribution to the developer cluster tool 820, which resides within dedicated fab floor space 818, piping for developer is simplified compared to previous "track tool" implementations where developing units were distributed over a wider area of fab floor space. After developing, the wafers are re-loaded into the pod on the fifth Pod Load/Unload station 832e, the pod is closed, and the fifth conveyor cluster transfer assembly 830e provides the pod back to the conveyor 828.

A sixth conveyor segment 828f then transfers the wafers to the sixth floor space area 822 where the hard bake cluster tool 824 resides. The sixth conveyor transfer assembly 830f transfers the SMIF pod or FOUP from the conveyor 828 onto the sixth Pod Load/Unload station, wherein the pod is again opened. A sixth cluster transfer assembly 834f then transfers wafers from the opened pod into individual hard bake units 858, which can manifest as hotplates. The hard bake units 858 can carry out a "hard bake" routine, which hardens the developed photoresist image to withstand harsh environments expected to be encountered in implantation or etching processes. After this hard bake, the wafers are re-loaded into the pod on the sixth Pod Load/Unload station 832f, the pod is closed, and the sixth conveyor cluster transfer assembly 830f provides the pod back to the conveyor 828.

The wafers can then be processed through path 828g, for example implanted or etched, with the pattern in place; and after such processing the photoresist layer can be stripped and additional layers can be formed and patterned in a similar manner. In this way, successive layers of an IC can be built up.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein Therefore, the present disclosure relates to a lithographic tool arrangement for semiconductor workpiece processing configured to group semiconductor processing tools into clusters, and to selectively transfer a semiconductor workpiece between any one of a plurality of semiconductor processing tools of a first type in a first cluster tool to any one of a plurality of semiconductor process tools of a second type in a second cluster tool. In various embodiments the semiconductor processing tools comprise baking, coating, exposure, and/or developing tools configured to provide a modularization of these various components to optimize throughput and efficiency for a given lithographic process.

Some embodiments of the present disclosure relate to a semiconductor processing system. This system includes a first cluster tool including a first plurality of semiconductor processing tools arranged within a first housing, and a second cluster tool including a second plurality of semiconductor processing tools arranged within a second housing. A transfer assembly is configured to move a first semiconductor workpiece from the first cluster tool to the second cluster tool through a first processing path, and is further configured to subsequently move a second semiconductor workpiece from the first cluster tool to the second cluster tool according to a second processing path, wherein the first processing path is different than the second processing path.

Other embodiments relate to an ebeam direct write (EBDW) lithography tool. A housing surrounds a transfer chamber, which is kept at a first pressure that is lower than an ambient pressure of an ambient environment external to the housing. A loadlock is configured to transfer wafers between the ambient environment and the transfer chamber. The loadlock retains a second pressure that is between the first pressure and the ambient pressure. A number of exposure units are arranged within the transfer chamber and include a number of alignment stages, respectively, and a number of exposure stages, respectively.

The exposure units retain a third pressure that is less than the second pressure. A radial transfer arm is configured to receive a semiconductor workpiece from the loadlock and to selectively transfer the semiconductor workpiece to an alignment stage and exposure stage of an exposure unit.

Still other embodiments relate to a semiconductor fabrication facility having floor space on which a number of semiconductor processing tools are arranged. A conveyor is adapted to carry a pod of wafers through a number of different floor space areas of the facility. Respective floor space areas are dedicated to different semiconductor process operations, respectively. A first cluster tool resides in a first floor space area and includes a first number of semiconductor processing tools that are each configured to perform a first semiconductor process operation on the wafers. A second cluster tool resides in a second floor space area exclusive of the first floor space area. The second cluster tool includes a second number of semiconductor processing tools that are each configured to perform a second semiconductor process operation on the wafers. The second semiconductor process operation differs from the first semiconductor process operation.

What is claimed is:

1. A semiconductor processing system, comprising:
a first cluster tool including a first plurality of semiconductor processing tools arranged within a first housing;
a second cluster tool including a second plurality of semiconductor processing tools arranged within a second housing; and
a transfer assembly configured to move a first semiconductor workpiece through the first and second cluster tools via a first processing path, and further configured to subsequently move a second semiconductor workpiece through the first and second cluster tools via a second processing path, wherein the first processing path is different than the second processing path.

2. The semiconductor processing system of claim 1:
wherein the transfer assembly is configured to move the first semiconductor workpiece over the first processing path by transferring the first semiconductor workpiece from a first semiconductor processing tool in the first cluster tool directly to a second semiconductor processing tool in the second cluster tool; and
wherein the transfer assembly is further configured to subsequently move the second semiconductor workpiece over the second processing path by transferring the second semiconductor workpiece from the first semiconductor processing tool in the first cluster tool directly to a third semiconductor processing tool in the second cluster tool, wherein the third semiconductor processing tool is different from the second semiconductor processing tool.

3. The semiconductor processing system of claim 1:
wherein the transfer assembly is configured to move the first semiconductor workpiece over the first processing path by transferring the first semiconductor workpiece from a first semiconductor processing tool in the first cluster tool directly to a second semiconductor processing tool in the second cluster tool; and
wherein the transfer assembly is further configured to subsequently move the second semiconductor workpiece over the second processing path by transferring the second semiconductor workpiece from a third semiconductor processing tool in the first cluster tool directly to the second semiconductor processing tool in the second cluster tool, wherein the third semiconductor processing tool is different from the first semiconductor processing tool.

4. The semiconductor processing system of claim 1, wherein the first cluster tool is a baking unit cluster tool and the first plurality of semiconductor processing tools in the first cluster tool are a plurality of hotplates, respectively.

5. The semiconductor processing system of claim 4, further comprising: a controller configured to independently control individual times and individual temperatures of the hotplates so different baking conditions can be applied to the first and second semiconductor workpieces.

6. The semiconductor processing system of claim 4, wherein the second cluster tool is a coating unit cluster tool and the second plurality of semiconductor processing tools in the second cluster tool are a plurality of spin coaters, respectively.

7. The semiconductor processing system of claim 4, further comprising: a controller configured to supply a first photoresist coating from a first photoresist reservoir to the first semiconductor workpiece and to supply a second photoresist coating from a second photoresist reservoir to the second semiconductor workpiece, wherein the first and second photoresist coatings are different.

8. The semiconductor processing system of claim 1, further comprising:
a controller configured to detect when a semiconductor processing tool of the second cluster tool has a maintenance issue and further configured to re-route wafers which were scheduled to be processed by the semiconductor processing tool having the maintenance issue to another semiconductor processing tool of the second cluster tool.

9. An electron beam direct write (EBDW) lithography tool, comprising:
a housing surrounding a transfer chamber, wherein the transfer chamber is kept at a first pressure that is lower than an ambient pressure of an ambient environment external to the housing;
a loadlock configured to transfer wafers between the ambient environment and the transfer chamber, wherein the loadlock retains a second pressure that is between the first pressure and the ambient pressure;
a plurality of exposure units arranged within the transfer chamber and including a plurality of alignment stages, respectively, and a plurality of exposure stages, respectively, wherein the exposure units retain a third pressure that is less than the second pressure; and
a radial transfer arm configured to receive a semiconductor workpiece from the loadlock and to selectively transfer the semiconductor workpiece to an alignment stage and exposure stage of an exposure unit.

10. The EBDW lithography tool of claim 9, wherein the loadlock includes a plurality of separate loadlock chambers to separately transfer individual semiconductor workpieces from the ambient environment to the transfer chamber.

11. The EBDW lithography tool of claim 10, wherein the radial transfer arm rotates about a pivot point, which corresponds to a central region of the radial transfer arm, to selectively transfer the semiconductor workpiece from the loadlock to an alignment stage or exposure stage of an exposure unit.

12. The EBDW lithography tool of claim 10, wherein the radial transfer arm includes wafer engagement elements at distal ends thereof.

13. A semiconductor fabrication facility having floor space on which a plurality of semiconductor processing tools are arranged, comprising:
a conveyor adapted to carry a pod of wafers through a number of different floor space areas of the facility, wherein respective floor space areas are dedicated to different semiconductor process operations, respectively;
a first cluster tool residing in a first floor space area and including a first plurality of semiconductor processing tools that are each configured to perform a first semiconductor process operation on the wafers; and
a second cluster tool residing in a second floor space area exclusive of the first floor space area, wherein the second cluster tool includes a second plurality of semiconductor processing tools that are each configured to perform a second semiconductor process operation on the wafers, wherein the second semiconductor process operation differs from the first semiconductor process operation.

14. The semiconductor fabrication facility of claim 13, further comprising:
a first conveyor transfer assembly configured to transfer the pod of wafers between the conveyor and a first pod load/unload station; and
a first cluster transfer assembly configured to load the wafers between the first pod load/unload station and individual semiconductor processing tools in the first cluster tool;
a second conveyor transfer assembly configured to transfer the pod of wafers between the conveyor and a second pod load/unload station; and
a second cluster transfer assembly configured to load the wafers between the second pod load/unload station and individual semiconductor processing tools in the second cluster tool.

15. The semiconductor fabrication facility of claim 14, wherein the first cluster tool is a pre-bake cluster tool and a semiconductor processing tool in the first cluster tool is a hotplate.

16. The semiconductor fabrication facility of claim 15, wherein the second cluster tool is an exposure cluster tool that includes at least two different types of scanners.

17. The semiconductor fabrication facility of claim 16, wherein the exposure cluster tool includes at least one immersion scanner and at least one e-beam direct write (EBDW) scanner.

18. The semiconductor fabrication facility of claim 13, wherein the first cluster tool is a baking/coating cluster tool with baking units and coating units which reside within a housing of the first cluster tool.

19. The semiconductor fabrication facility of claim 18, further comprising:
a hexamethyidisilazane (HDMS) reservoir and common HEMS piping extending from the HDMS reservoir to the baking units of the baking/coating cluster tool; and
a photoresist reservoir and common photoresist piping extending from the photoresist reservoir to the coating units of the baking/coating cluster tool.

20. The semiconductor fabrication facility of claim 19, further comprising:
recirculation piping configured to capture excess HDMS or photoresist used to process an initial wafer in the baking/coating cluster tool and to re-circulate the excess HDMS or photoresist for use on a subsequent wafer.

* * * * *